United States Patent
Yamahana

(10) Patent No.: US 9,829,906 B2
(45) Date of Patent: Nov. 28, 2017

(54) CURRENT MIRROR CIRCUIT AND RECEIVER USING THE SAME

(71) Applicant: MegaChips Corporation, Osaka (JP)

(72) Inventor: Ryota Yamahana, Chiba (JP)

(73) Assignee: MegaChips Corporation, Osaka (JP)

( * ) Notice: Subject to any disclaimer, the term of this patent is extended or adjusted under 35 U.S.C. 154(b) by 176 days.

(21) Appl. No.: 14/669,063

(22) Filed: Mar. 26, 2015

(65) Prior Publication Data

US 2015/0277470 A1    Oct. 1, 2015

(30) Foreign Application Priority Data

Mar. 26, 2014   (JP) .................................. 2014-063372

(51) Int. Cl.
  *G05F 3/26* (2006.01)
  *H04B 10/60* (2013.01)
  *H03G 3/30* (2006.01)
  *H03F 3/50* (2006.01)

(52) U.S. Cl.
  CPC ............ *G05F 3/262* (2013.01); *H03G 3/3084* (2013.01); *H04B 10/60* (2013.01); *H03F 3/50* (2013.01); *H03F 2200/474* (2013.01); *H03F 2203/21115* (2013.01)

(58) Field of Classification Search
  CPC .................. H03F 3/08; H03F 2200/474; H03F 2203/21115; H03F 2203/5009; H03F 3/50; H03G 3/3084; H04B 10/60
  USPC .......................................................... 398/202
  See application file for complete search history.

(56) References Cited

U.S. PATENT DOCUMENTS

| | | | | |
|---|---|---|---|---|
| 4,937,469 A | * | 6/1990 | Larson ..................... | G05F 3/262 326/21 |
| 6,329,881 B1 | * | 12/2001 | Tachigori .................. | H03F 3/08 250/214 A |
| 6,900,689 B2 | | 5/2005 | Kimura | |
| 7,242,241 B2 | * | 7/2007 | Toumazou .............. | G05F 3/262 323/315 |
| 9,195,252 B1 | * | 11/2015 | Tanase ....................... | G05F 3/02 |
| 2002/0163379 A1 | * | 11/2002 | Kimura ..................... | G05F 3/30 327/540 |
| 2004/0113663 A1 | * | 6/2004 | Gabillard ................ | G05F 1/561 327/103 |

(Continued)

FOREIGN PATENT DOCUMENTS

| | | |
|---|---|---|
| JP | 2002-270768 A | 9/2002 |
| JP | 2008-288900 A | 11/2008 |

*Primary Examiner* — David Payne
*Assistant Examiner* — Tanya Motsinger
(74) *Attorney, Agent, or Firm* — Osha Liang LLP

(57) ABSTRACT

A current mirror circuit that amplifies a reference current generated by a current source at a first magnification to supply a mirror current to a load circuit. The current mirror circuit includes a first transistor and a second transistor that share a power supply, and a drain potential mirror unit that amplifies the reference current at a second magnification to generate a first current, that amplifies a generated first current at a third magnification to generate a second current, and that supplies a predetermined potential determined based on the second current to a drain of the second transistor. The mirror current is supplied from the second transistor to the load circuit based on a potential of a gate of the first transistor determined based on the reference current.

20 Claims, 9 Drawing Sheets

(56) References Cited

U.S. PATENT DOCUMENTS

| | | | |
|---|---|---|---|
| 2006/0038618 A1* | 2/2006 | Wang | G05F 3/262 |
| | | | 330/288 |
| 2006/0251428 A1* | 11/2006 | Gieseler | H03F 3/45085 |
| | | | 398/189 |
| 2008/0002481 A1* | 1/2008 | Gogl | G11C 5/02 |
| | | | 365/189.06 |
| 2008/0101802 A1* | 5/2008 | Yano | H03F 3/08 |
| | | | 398/202 |
| 2008/0174289 A1* | 7/2008 | Gurcan | G05F 1/575 |
| | | | 323/280 |
| 2008/0290942 A1 | 11/2008 | Shimizu | |
| 2009/0058393 A1* | 3/2009 | Huang | H02J 7/0052 |
| | | | 323/316 |
| 2009/0146739 A1* | 6/2009 | Shimizu | H03F 3/08 |
| | | | 330/288 |
| 2013/0322886 A1* | 12/2013 | Uemura | H04B 10/50 |
| | | | 398/135 |
| 2015/0155951 A1* | 6/2015 | Noda | H04B 10/616 |
| | | | 398/202 |
| 2015/0214903 A1* | 7/2015 | Zhang | H03F 1/301 |
| | | | 330/291 |
| 2015/0295659 A1* | 10/2015 | Nogami | H03F 3/08 |
| | | | 398/212 |
| 2016/0147247 A1* | 5/2016 | Roham | G05F 3/262 |
| | | | 323/315 |
| 2017/0012672 A1* | 1/2017 | Peter | H03F 3/193 |

* cited by examiner

CURRENT MIRROR CIRCUIT AND RECEIVER USING THE SAME

FIELD OF THE INVENTION

One or more embodiments of the present invention relates to a current mirror circuit and a receiver using a current mirror.

BACKGROUND OF THE INVENTION

In the information society, it has become increasingly important to communicate using an optical signal to quickly transmit and receive a larger amount of information. A communication system using such an optical signal may comprise a transmitter, a receiver, and an optical fiber connecting the transmitter and the receiver. In the communication system using the optical signal, the transmitter converts an electrical signal to an optical signal in one of two states "1" and "0" corresponding to the light strength, and the receiver converts the optical signal back to an electrical signal in order to transmit information. Measurement of the strength of the optical signal is important for the receiver in order to accurately read the information indicated by the optical signal.

The receiver in the communication system using the optical signal may comprise: a photodiode that converts the optical signal to a current signal; a unit that measures the strength of the optical signal; and a logic unit that executes a process according to the optical signal based on the current signal and the strength of the optical signal. A potential difference at a stable magnitude is necessary at both ends of the photodiode in order to convert the optical signal to the current signal. The receiver may prevent a circuit connected to a serial part of the photodiode from affecting the potentials at both ends of the photodiode. The photodiode may generate a current signal in a significantly wide range from several µA (microampere) to several mA, and thus means for preventing the circuit connected to the serial part of the photodiode from affecting the potentials at both ends of the photodiode needs to handle a wide range of current signal generated by the photodiode.

It is known that two or more circuits that operate in a current mode are connected to each other, and a current mirror circuit is provided between a circuit of a former part and a circuit of a serial part to prevent the circuit of the serial part from affecting the circuit of the former part. Separately, a current mirror circuit using a CMOS (Complementary Metal Oxide Semiconductor) transistor used in the technique, in which a reference current is highly accurately amplified based on not only a replication of the potential difference between the gate and the source of the transistor, but also a replication of the potential difference between the drain and the source.

For example, Japanese Patent Laid-Open No. 2008-288900 (hereinafter, called "'900 Publication") discloses a differential amplifier including: an input differential pair; cascode current mirror circuits with at least two stages connected as a load to the input differential pair; a tail current source that supplies a tail current to the input differential pair; and a constant current source connected in parallel with the input differential pair to supply a constant current to the tail current source.

For example, Japanese Patent Laid-Open No. 2002-270768 (hereinafter, called "'768 Publication") discloses a CMOS reference voltage circuit including: first and second diode-connected transistors that are grounded and driven by two constant currents at a certain current ratio; and means for amplifying a difference voltage of output voltages of the first and second diode-connected transistors at a certain magnification and adding the voltage to the output voltage from the first or second diode-connected transistor. In the disclosed CMOS reference voltage circuit, the means for amplifying and adding includes first and second operational transconductance amplifiers (hereinafter, called "OTA") and a current mirror circuit. An output terminal voltage of the second OTA is handled as an output voltage, and the first OTA inputs the difference voltage. A normal phase input terminal of the second OTA receives the output voltage of the first or second diode-connected transistor, and a reverse phase input terminal receives the output voltage of the second OTA. The CMOS reference voltage circuit is driven by a current according to an output current of the first OTA.

In the conventional differential amplifier as described above, the cascode current mirror circuits are used to highly accurately amplify the input current of the differential amplifier while preventing an increase in the chip area. However, the voltage applied to the input differential pair is reduced by the potential difference between the sources and the gates of the cascode-connected transistors when the input current is large in the differential amplifier disclosed in '900 Publication. Necessarily, the range of the input current is limited.

Furthermore, the conventional CMOS reference voltage circuit as described uses the current mirror circuit by way of using the OTA to highly accurately amplify the input current while eliminating the effect of the cascode connection on an element on the input side. However, the OTA requires a large chip area to handle a wide range of input current in the CMOS reference voltage circuit disclosed in '768 Publication.

SUMMARY

One or more embodiments of the present invention generally relate to a current mirror circuit that can highly accurately amplify a current while preventing an increase in the chip area and handling a wide range of input current.

One or more embodiments of the present invention provides a receiver that can highly accurately measure the strength of an optical signal while preventing an increase in the chip area and handling a wide range of input current.

One or more embodiments of the present invention provides a receiver that can change the resolution in the measurement of the strength of an optical signal according to the magnitude of an input current.

One or more embodiments of the present invention provides a receiver that can prevent frequent changes in the resolution in the measurement of the strength of an optical signal caused by fluctuation of an input current around a current value that changes the resolution in the measurement of the strength of the optical signal.

One or more embodiments of the present invention comprise a current mirror circuit that amplifies a reference current generated by a current source at a first magnification to supply a mirror current to a load circuit. The current mirror circuit may comprise: a first transistor and a second transistor that may share a power supply; and a drain potential mirror unit that may amplify the reference current at a second magnification to generate a first current, amplify the generated first current at a third magnification to generate a second current, and supply a predetermined potential determined based on the second current to a drain of the second transistor. The mirror current may be supplied from the second transistor to the load circuit based on a potential of a gate of the first transistor determined based on the reference current.

In the current mirror circuit, the second magnification and the third magnification may be determined so that the predetermined potential is a potential substantially equal to a potential of a drain of the first transistor.

The drain potential mirror unit may comprise: a third transistor and a sixth transistor that may share the power supply shared by the first transistor; and a fourth transistor and a fifth transistor that may have a common source potential. The drain potential mirror unit may supply the first current from the third transistor to the fourth transistor based on the potential of the gate of the first transistor determined based on the reference current, supply the second current from the fifth transistor to the sixth transistor based on a potential of a gate of the fourth transistor determined based on the first current, and supply, as the predetermined potential, a potential of a gate of the sixth transistor determined based on the second current to the drain of the second transistor.

The drain potential mirror unit may further comprise a seventh transistor provided between the second transistor and the load circuit.

In the current mirror circuit, a potential substantially equal to a potential of a drain of the sixth transistor may be provided to a gate of the seventh transistor.

The first transistor, the second transistor, the third transistor, and the sixth transistor may be PMOS transistors, and the fourth transistor and the fifth transistor may be NMOS transistors.

The first transistor, the second transistor, the third transistor, and the sixth transistor may be NMOS transistors, and the fourth transistor and the fifth transistor may be PMOS transistors.

A receiver according to one or more embodiments of the present invention may measure a strength of an optical signal output from a transmitter. The receiver may comprise: a photodetector that may generate a reference current based on the optical signal; a current mirror circuit that may amplify the reference current at a predetermined magnification to generate a mirror current, a current mode AD converter that may convert the mirror current to a digital voltage signal at a predetermined conversion rate, and a logic unit that may measure the strength of the optical signal indicated by the digital voltage signal.

The current mirror circuit may comprise: a first transistor and a second transistor which may share a power supply; and a drain potential mirror unit that may amplify the reference current at a second magnification to generate a first current, amplify the generated first current at a third magnification to generate a second current, and supply a predetermined potential determined based on the second current to a drain of the second transistor. The mirror current may be supplied from the second transistor to the current mode AD converter based on a potential of a gate of the first transistor determined based on the reference current.

The current mirror circuit may determine the second magnification and the third magnification so that the predetermined potential is a potential substantially equal to a potential of a drain of the first transistor.

The drain potential mirror unit may comprise: a third transistor and a sixth transistor that may share the power supply shared by the first transistor; and a fourth transistor and a fifth transistor that may have a common source potential. The drain potential mirror unit may supply the first current from the third transistor to the fourth transistor based on the potential of the gate of the first transistor determined based on the reference current, supply the second current from the fifth transistor to the sixth transistor based on a potential of a gate of the fourth transistor determined based on the first current, and supply, as the predetermined potential, a potential of a gate of the sixth transistor determined based on the second current to the drain of the second transistor.

The drain potential mirror unit may further comprise a seventh transistor provided between the second transistor and the load circuit. The drain potential mirror unit may supply a potential substantially equal to a potential of a drain of the sixth transistor to a gate of the seventh transistor.

The receiver may further comprise a voltage comparator that may compare a first potential determined based on the reference current and a second potential based on a bias circuit to determine whether the first potential is higher than the second potential. The current mode AD converter may determine the predetermined conversion rate based on the determination by the voltage comparator. The logic unit may measure the strength of the optical signal indicated by the digital voltage signal according to the determination by the voltage comparator.

The current mode AD converter may comprise: a variable resistance with a resistance value determined based on the determination by the voltage comparator, the variable resistance converting the mirror current to an analog voltage signal at a voltage drop according to the mirror current; and an AD converter that may convert the analog voltage signal to the digital voltage signal.

The current mode AD converter may set the predetermined conversion rate to a first value if the voltage comparator determines that the first potential is higher than the second potential and may set the predetermined conversion rate to a second value not higher than the first value if the voltage comparator determines that the first potential is not higher than the second potential.

The voltage comparator may generate a comparison signal with a potential determined based on the determination and may determine the second potential based on the potential of the comparison signal.

The voltage comparator may determine a state of the comparison signal to be a first state if the voltage comparator determines that the first potential is higher than the second potential, determine the state of the comparison signal to be a second state if the voltage comparator determines that the first potential is not higher than the second potential, determine the second potential to be a third potential if the state of the comparison signal is the first state, and determine the second potential to be a fourth potential higher than the third potential if the state of the comparison signal is the second state.

The receiver may further comprise a plurality of the voltage comparators. The plurality of voltage comparators may determine the second potentials so that the second potentials are different. The current mode AD converter may determine the predetermined conversion rate based on the determinations by the plurality of voltage comparators.

The current mode AD converter may comprise: a plurality of variable resistances with resistance values determined based on the determinations by the corresponding plurality of voltage comparators, the plurality of variable resistances converting the mirror current to an analog voltage signal at a voltage drop according to the mirror current; and an AD converter that may convert the analog voltage signal to the digital voltage signal.

According to one or more embodiments of the present invention, the current mirror circuit can highly and accurately amplify a current while preventing an increase in the chip area and handling a wide range of input current.

According to one or more embodiments of the present invention, the receiver can highly accurately measure the strength of an optical signal while preventing an increase in the chip area and handling a wide range of input current.

According to one or more embodiments of the present invention, a receiver can change the resolution in the measurement of the strength of an optical signal according to the magnitude of an input current.

According to one or more embodiments of the present invention, a receiver can prevent frequent changes in the resolution in the measurement of the strength of an optical signal caused by fluctuation of an input current around a current value that changes the resolution in the measurement of the strength of the optical signal.

Other technical features, objects, effects, and advantages of the present invention will become apparent from the following embodiments described with reference to the attached drawings.

DETAILED DESCRIPTION

Figure 1:
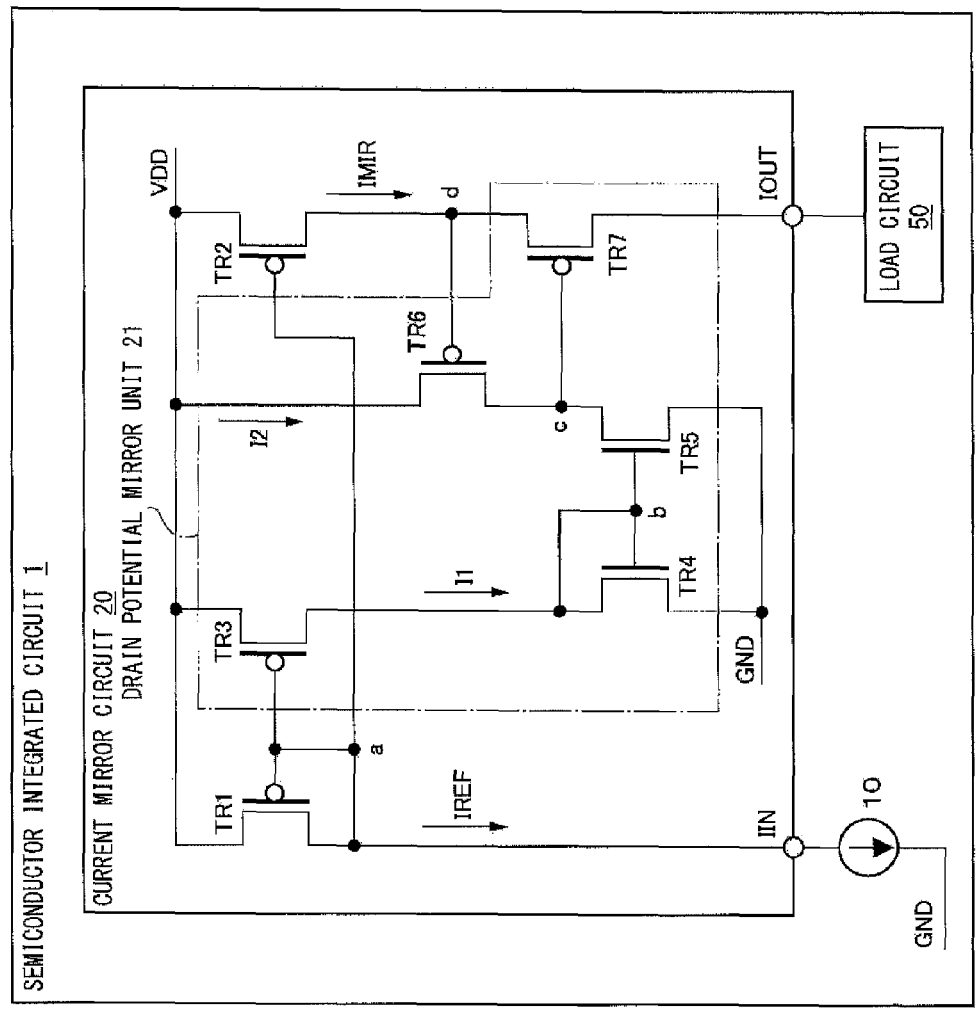
FIG. 1 is a diagram showing an example of a configuration of a semiconductor integrated circuit according to one or more embodiments of the present invention.

Hereinafter, embodiments of the present invention will be described with reference to the drawings. In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention. FIG. 1 is a diagram showing an example of a semiconductor integrated circuit (IC) according to one or more embodiments of the present invention. As shown in FIG. 1, a semiconductor IC 1 may comprise a current source 10, a current mirror circuit 20, and a load circuit 50.

The current source 10 may be, for example, a MOS transistor that generates a reference current IREF in the current mirror circuit 20. The current source 10 may be connected to the drain of a transistor TR1 and the gates of transistors TR1 to TR3 through a current input terminal IIN and a node a of the current mirror circuit 20. In this way, a current flowing through the transistors TR1 to TR3 in the current mirror circuit 20 may be drawn as the reference current IREF.

The current mirror circuit 20 may amplify the reference current IREF drawn by the current source 10 through the current input terminal IIN at a predetermined magnification and supply a mirror current IMIR from a current output terminal IOUT to the load circuit 50. The current mirror circuit 20 may comprise, for example, transistors TR1 to TR7. The predetermined magnification may be determined by the ratio of the gate sizes (gate width/gate length) of the transistors TR1 and TR2. For example, the predetermined magnification may be 1 when the gate sizes of the transistors TR1 and TR2 are the same, and the current mirror circuit 20 may handle a current value of the reference current IREF as a current value of the mirror current IMIR to generate the mirror current IMIR.

In the current mirror circuit 20, the node a may be provided on wiring connected with the transistors TR1 to TR3. A node b may be provided on wiring connected with the transistors TR3 to TR5. A node c may be provided on wiring connected with the transistors TR5 to TR7. A node d may be provided on wiring connected with the transistors TR2, TR6, and TR7.

The transistor TR1 may function as a current voltage conversion element to determine the potential of the node a based on the reference current IREF drawn by the current source 10. The transistor TR1 may comprise, for example, a P-type MOS transistor. In this case, the source of the transistor TR1 may be connected to a power line VDD, and the drain may be connected to the current source 10 and the gates of the transistors TR1 to TR3 through the node a.

The transistor TR2 may function as a voltage current conversion element to generate the mirror current IMIR based on the potential of the node a determined by the transistor TR1 and the potential of the node d determined by a drain potential mirror unit 21 as will be described later and to supply the current to the load circuit 50 through the transistor TR7 and the current output terminal IOUT. The transistor TR2 may comprise, for example, a P-type MOS transistor. In this case, the source of the transistor TR2 may be connected to the power line VDD, and the drain may be connected to the gate of the transistor TR6 and the source of the transistor TR7 through the node d. As described, the gate may be connected to the current source 10, the drain of the transistor TR1, and the gates of the transistors TR1 to TR3 through the node a.

The transistor TR3 may function as a voltage current conversion element to generate a current I1 based on the potential of the node "a" and supply the current to the transistors TR4 and TR5. The transistor TR3 may comprise, for example, a P-type MOS transistor. In this case, the source of the transistor TR3 may be connected to the power line VDD, and the drain may be connected to the drain of the transistor TR4 and the gates of the transistors TR4 and TR5 through the node b. As described, the gate may be connected to the current source 10, the drain of the transistor TR1, and the gates of the transistors TR1 and TR2 through the node a. The transistor TR3, along with the transistors TR4 to TR7, may constitute the drain potential mirror unit 21, and the details of the operation will be described later.

The transistor TR4 may function as a current voltage conversion element to determine the potential of the node b based on the current I1 supplied by the transistor TR3. The transistor TR4 may comprise, for example, an N-type MOS transistor. In this case, the source of the transistor TR4 may be connected to a grounding wire GND, and the drain may be connected to the drain of the transistor TR3 and the gates of the transistors TR4 and TR5 through the node b. The transistor TR4, along with the transistors TR3, TR5, TR6, and TR7, may constitute the drain potential mirror unit 21, and the details of the operation will be described later.

The transistor TR5 may function as a voltage current conversion element to generate a current I2 based on the potential of the node b. The transistor TR5 may comprise, for example, an N-type MOS transistor. In this case, the source of the transistor TR5 may be connected to the grounding wire GND, and the drain may be connected to the drain of the transistor TR6 and the gate of the transistor TR7 through the node c. As described, the gate may be connected to the drains of the transistors TR3 and TR4 and the gate of the transistor TR4 through the node b. In this way, a current flowing through the transistor TR6 is drawn as the current I2. The transistor TR5, along with the transistors TR3, TR4, TR6, and TR7, may constitute the drain potential mirror unit 21, and the details of the operation will be described later.

The transistor TR6 may function as a current voltage conversion element to determine the potential of the node d based on the current I2 drawn by the transistor TR5. The transistor TR6 may comprise, for example, a P-type MOS transistor. In this case, the source of the transistor TR6 may be connected to the power line VDD, and the drain may be connected to the drain of the transistor TR5 and the gate of the transistor TR7 through the node c. The gate may be connected to the drain of the transistor TR2 and the source of the transistor TR7 through the node d. The transistor TR6, along with the transistors TR3, TR4, TR5, and TR7, may constitute the drain potential mirror unit 21, and the details of the operation will be described in detail later.

The transistor TR7 may function as a buffer to prevent the load circuit 50 from affecting the potential of the node d. The transistor TR7 may comprise, for example, a P-type MOS transistor. In this case, the source of the transistor TR7 may be connected to the gate of the transistor TR6 and the drain of the transistor TR2 through the node d, and the drain may be connected to the load circuit 50 through the current output terminal IOUT. As described, the gate is connected to the drains of the transistors TR5 and TR6 through the node c. The transistor TR7, along with the transistors TR3 to TR6, may constitute the drain potential mirror unit 21, and the details of the operation will be described later.

As described above, the transistors TR3 to TR7 may constitute the drain potential mirror unit 21. The drain potential mirror unit 21 may adjust the potential of the drain of the transistor TR2 to a potential substantially equal to the potential of the drain of the transistor TR1. Specifically, the drain potential mirror unit 21 may amplify the reference current IREF at a predetermined magnification through the transistor TR3 to supply the current I1 to the transistor TR4. The drain potential mirror unit 21 may replicate the current I1 through the transistors TR4 and TR5 to draw the current as the current I2 from the transistor TR6. The drain potential mirror unit 21 may determine the potential of the node d (i.e., potential of the drain of the transistor TR2) based on the transistor TR6 and the current I2 and may prevent the load circuit 50 from affecting the potential of the node d through the transistor TR7. The current I2 flowing between the source and the drain of the transistor TR6 and the reference current IREF flowing between the source and the drain of the transistor TR1 may become substantially equal, and the sources of the transistors TR1 and TR6 may be connected to the power line VDD. As a result, the potential of the gate of the transistor TR6 may become substantially equal to the potential of the gate of the transistor TR1. Therefore, the drain potential mirror unit 21 may adjust the potential of the node d that is the potential of the drain of the transistor TR2 to be substantially equal to the potential of the node "a" that is the potential of the drain of the transistor TR1.

Although the drain potential mirror unit 21 may amplify the reference current IREF at the predetermined magnification to generate the current I1, replicate the current I1 (i.e., amplify at a magnification of 1) to generate the current I2, and determine the potential of the node d based on the current I2 and the transistor TR6 in the present example, the arrangement is not limited to this situation. In the drain potential mirror unit 21, the current values of the current I1 and the current I2 may be arbitrary current values within a range satisfying the condition that the potential of the node d be a potential substantially equal to the potential of the node a. Therefore, the gate sizes of the transistors TR3 to TR7 in the drain potential mirror unit 21 may be arbitrary values within a range satisfying the condition that the potential of the node d be a potential substantially equal to the potential of the node a.

In the current mirror circuit 20 with the configuration, the drain potential mirror unit 21 may determine the potential of the node d that is the drain potential of the transistor TR2 to be a potential substantially equal to the potential of the node a that is the drain potential of the transistor TR1. Therefore, the current mirror circuit 20 can amplify the reference current IREF drawn by the current source 10 at a substantially equal accuracy and supply the mirror current IMIR to the load circuit 50. The configuration of the drain potential mirror unit 21 is simple, and thus the current mirror circuit 20 can prevent an increase in the chip area. The current mirror circuit 20 may also suppress the reduction in the potential from the power line VDD to the current input terminal IIN (i.e., node a), to the potential difference between the gate and the source of the transistor TR1. The potential difference between the gate and the source of the transistor TR1 may be determined based on the reference current IREF, and the current mirror circuit 20 can operate at a wide range of the reference current IREF.

The load circuit 50 may be, for example, variable resistances, capacitive elements, and an interface of various digital circuits and may be driven by the mirror current IMIR supplied from the current mirror circuit 20. The load circuit 50 may be connected to the drain of the transistor TR7 through the current output terminal IOUT of the current mirror circuit 20.

As described above, the current mirror circuit 20 in the semiconductor IC 1 can highly accurately amplify the current of the current source 10 to supply the current to the load circuit 50. The current mirror circuit 20 of the semiconductor IC 1 can also highly accurately amplify the current to supply the current to the load circuit 50 while preventing an increase in the chip area and handling a wide range of input current.

Figure 2:
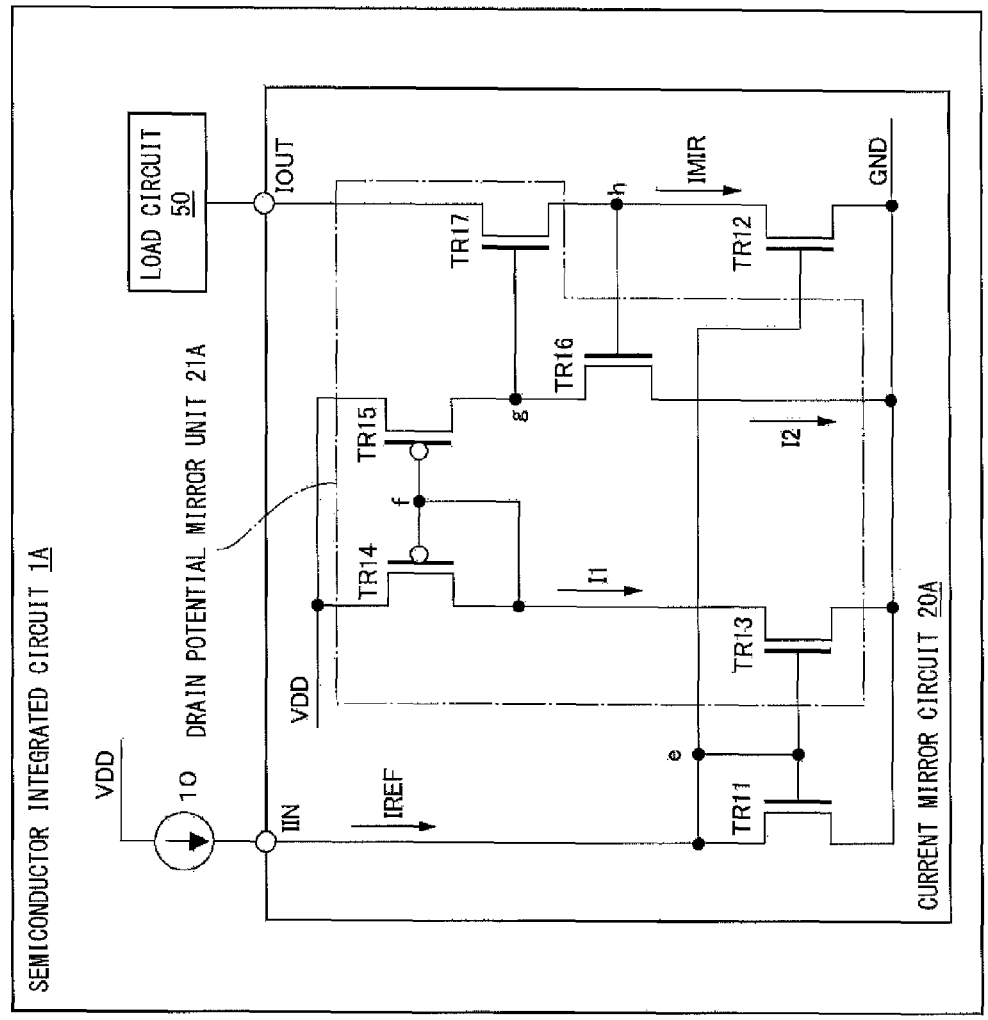
FIG. 2 is a diagram showing an example of a configuration of a semiconductor integrated circuit according to one or more embodiments of the present invention.

FIG. 2 is a diagram showing an example of a configuration of a semiconductor IC according to one or more embodiments of the present invention. As shown in FIG. 2, a semiconductor IC 1A may comprise the current source 10, a current mirror circuit 20A, and the load circuit 50.

The current source 10 may generate the reference current IREF in the current mirror circuit 20A and may supply the current to transistors TR11 to TR13 through the current input terminal IIN and a node e of the current mirror circuit 20A. The current source 10 may be connected to the drain of the transistor TR11 and the gates of the transistors TR11 to TR13 through the current input terminal IIN and the node e.

The current mirror circuit 20A may amplify the reference current IREF supplied from the current source 10 through the current input terminal IIN at a predetermined magnification to generate the mirror current IMIR. The current mirror circuit 20A may be connected to the load circuit 50 through the current output terminal IOUT. In this way, the amplified mirror current IMIR may be drawn from the load circuit 50. The current mirror circuit 20A may comprise, for example, transistors TR11 to TR17. The predetermined magnification may be determined by the ratio of the gate sizes of the transistors TR11 and TR12. For example, the predetermined magnification may be 1 when the gate sizes of the transistors TR11 and TR12 are the same, and the current mirror circuit 20A may handle the current value of the reference current IREF as the current value of the mirror current IMIR to generate the mirror current IMIR.

In the current mirror circuit 20A, the node e may be provided on wiring connected with the transistors TR11 to TR13. A node f may be provided on wiring connected with the transistors TR13 to TR15. A node g may be provided on wiring connected with the transistors TR15 to TR17. A node h may be provided on wiring connected with the transistors TR12, TR16, and TR17.

The transistor TR11 may function as a current voltage conversion element to determine the potential of the node e based on the reference current IREF supplied to the current source 10. The transistor TR11 may comprise, for example, an N-type MOS transistor. In this case, the source of the transistor TR11 may be connected to the grounding wire GND, and the drain may be connected to the current source 10 and the gates of the transistors TR11 to TR13 through the node e.

The transistor TR12 may function as a voltage current conversion element to generate the mirror current IMIR based on the potential of the node e determined by the transistor TR11 and the potential of the node h determined by a drain potential mirror unit 21A described later. The transistor TR12 may comprise, for example, an N-type MOS transistor. In this case, the source of the transistor TR12 may be connected to the grounding wire GND, and the drain may be connected to the gate of the transistor TR16 and the drain of the transistor TR17 through the node h. As described, the gate may be connected to the current source 10, the drain of the transistor TR11, and the gates of the transistors TR11 to TR13 through the node e. In this way, the current flowing from the load circuit 50 through the current output terminal IOUT and the transistor TR17 may be drawn as the mirror current IMIR from the load circuit 50.

The transistor TR13 may function as a voltage current conversion element to generate the current I1 based on the potential of the node e. The transistor TR13 may comprise, for example, an N-type MOS transistor. In this case, the source of the transistor TR13 may be connected to the grounding wire GND, and the drain may be connected to the drain of the transistor TR14 and the gates of the transistors TR14 and TR15 through the node f. As described, the gate may be connected to the current source 10, the drain of the transistor TR11, and the gates of the transistors TR11 and TR12 through the node e. In this way, the current flowing through the transistor TR14 may be drawn as the current I1. The transistor TR13, along with the transistors TR14 to TR17, may constitute the drain potential mirror unit 21A, and the details of the operation will be described later.

The transistor TR14 may function as a current voltage conversion element to determine the potential of the node f based on the current I1 drawn by the transistor TR13. The transistor TR14 may comprise, for example, a P-type MOS transistor. In this case, the source of the transistor TR14 may be connected to the power line VDD, and the drain may be connected to the drain of the transistor TR13 and the gates of the transistors TR14 and TR15 through the node f. The transistor TR14, along with the transistors TR13, TR15, TR16, and TR17, may constitute the drain potential mirror unit 21A, and the details of the operation will be described later.

The transistor TR15 may function as a voltage current conversion element to generate the current I2 based on the potential of the node f and to supply the current to the transistor TR16. The transistor TR15 may comprise, for example, a P-type MOS transistor. In this case, the source of the transistor TR15 may be connected to the power line VDD, and the drain may be connected to the drain of the transistor TR16 and the gate of the transistor TR17 through the node g. As described, the gate may be connected to the drains of the transistors TR13 and TR14 and the gate of the transistor TR14 through the node f. The transistor TR15, along with the transistors TR13, TR14, TR16, and TR17, may constitute the drain potential mirror unit 21A, and the details of the operation will be described later.

The transistor TR16 may function as a current voltage conversion element to determine the potential of the node h based on the current I2 supplied by the transistor TR15. The transistor TR16 may comprise, for example, an N-type MOS transistor. In this case, the source of the transistor TR16 may be connected to the grounding wire GND, and the drain may be connected to the drain of the transistor TR15 and the gate of the transistor TR17 through the node g. The gate may be connected to the drain of the transistor TR12 and the source of the transistor TR17 through the node h. The transistor TR16, along with the transistors TR13, TR14, TR15, and TR17, may constitute the drain potential mirror unit 21A, and the details of the operation will be described later.

The transistor TR17 may function as a buffer to prevent the load circuit 50 from affecting the potential of the node h. The transistor TR17 may comprise, for example, an N-type MOS transistor. In this case, the source of the transistor TR17 may be connected to the gate of the transistor TR16 and the drain of the transistor TR12, and the drain may be connected to the load circuit 50 through the current output terminal IOUT. As described, the gate may be connected to the drains of the transistors TR15 and TR16 through the node g. The transistor TR17, along with the transistors TR13 to TR16, may constitute the drain potential mirror unit 21A, and the details of the operation will described later.

As described above, the transistors TR13 to TR17 may constitute the drain potential mirror unit 21A. The drain potential mirror unit 21A may adjust the potential of the drain of the transistor TR12 to a potential substantially equal to the potential of the drain of the transistor TR11. Specifically, the drain potential mirror unit 21A may amplify the reference current IREF at a predetermined magnification through the transistor TR13 to draw the current as the current I1 from the transistor TR14. The drain potential mirror unit 21A may replicate the current I1 through the transistors TR14 and TR15 to supply the current I2 to the transistor TR16. The drain potential mirror unit 21A may determine the potential of the node h (i.e. potential of the drain of the transistor TR12) based on the transistor TR16 and the current I2 and may prevent the load circuit 50 from affecting the potential of the node h through the transistor TR17. The reference current IREF flowing between the source and the drain of the transistor TR11 and the current I2 flowing between the source and the drain of the transistor TR16 may become substantially equal, and the sources of the transistors TR11 and TR16 may be connected to the grounding wire GND. As a result, the potential of the gate of the transistor TR16 may become substantially equal to the potential of the gate of the transistor TR11. Therefore, the drain potential mirror unit 21A may adjust the potential of the node e that is the potential of the drain of the transistor TR11 to be substantially equal to the potential of the node h that is the potential of the drain of the transistor TR12.

Although, in the present example, the drain potential mirror unit 21A may amplify the reference current IREF at the predetermined magnification to generate the current I1, replicate the current I1 (i.e., amplify at a magnification of 1) to generate the current I2, and determine the potential of the node h based on the current I2 and the transistor TR16, arrangement is not limited to this situation. In the drain potential mirror unit 21A, the current values of the current I1 and the current I2 may be arbitrary current values within a range satisfying the condition that the potential of the node h be a potential substantially equal to the potential of the node e. Therefore, the gate sizes of the transistors TR13 to TR17 in the drain potential mirror unit 21A may be arbitrary values within a range satisfying the condition that the potential of the node h be a potential substantially equal to the potential of the node e.

In the current mirror circuit 20A with the configuration, the drain potential mirror unit 21A may determine the potential of the node h that is the drain potential of the transistor TR12 to be a potential substantially equal to the potential of the node e that is the drain potential of the transistor TR11. Therefore, the current mirror circuit 20A can amplify the reference current IREF supplied from the current source 10 at a substantially equal accuracy and supply the mirror current IMIR to the load circuit 50. The configuration of the drain potential mirror unit 21A is simple, and the current mirror circuit 20A can prevent an increase in the chip area. The current mirror circuit 20A may also suppress the rise in the potential from the grounding wire GND to the potential of the current input terminal IIN (i.e., potential of node a), to the potential difference between the source and the gate of the transistor TR11. The potential difference between the gate and the source of the transistor TR11 may be determined based on the reference current IREF, and the current mirror circuit 20A can operate at a wide range of the reference current IREF.

The load circuit 50 may be driven by the mirror current IMIR drawn from the current mirror circuit 20A. The load circuit 50 may be connected to the drain of the transistor TR17 through the current output terminal IOUT of the current mirror circuit 20A.

As described above, the current mirror circuit 20A in the semiconductor IC 1A can highly accurately amplify the current of the current source 10 to supply the current to the load circuit 50. The current mirror circuit 20A of the semiconductor IC 1A can also highly accurately amplify the current to supply the current to the load circuit 50 while preventing an increase in the chip area and handling a wide range of input current.

Figure 3:
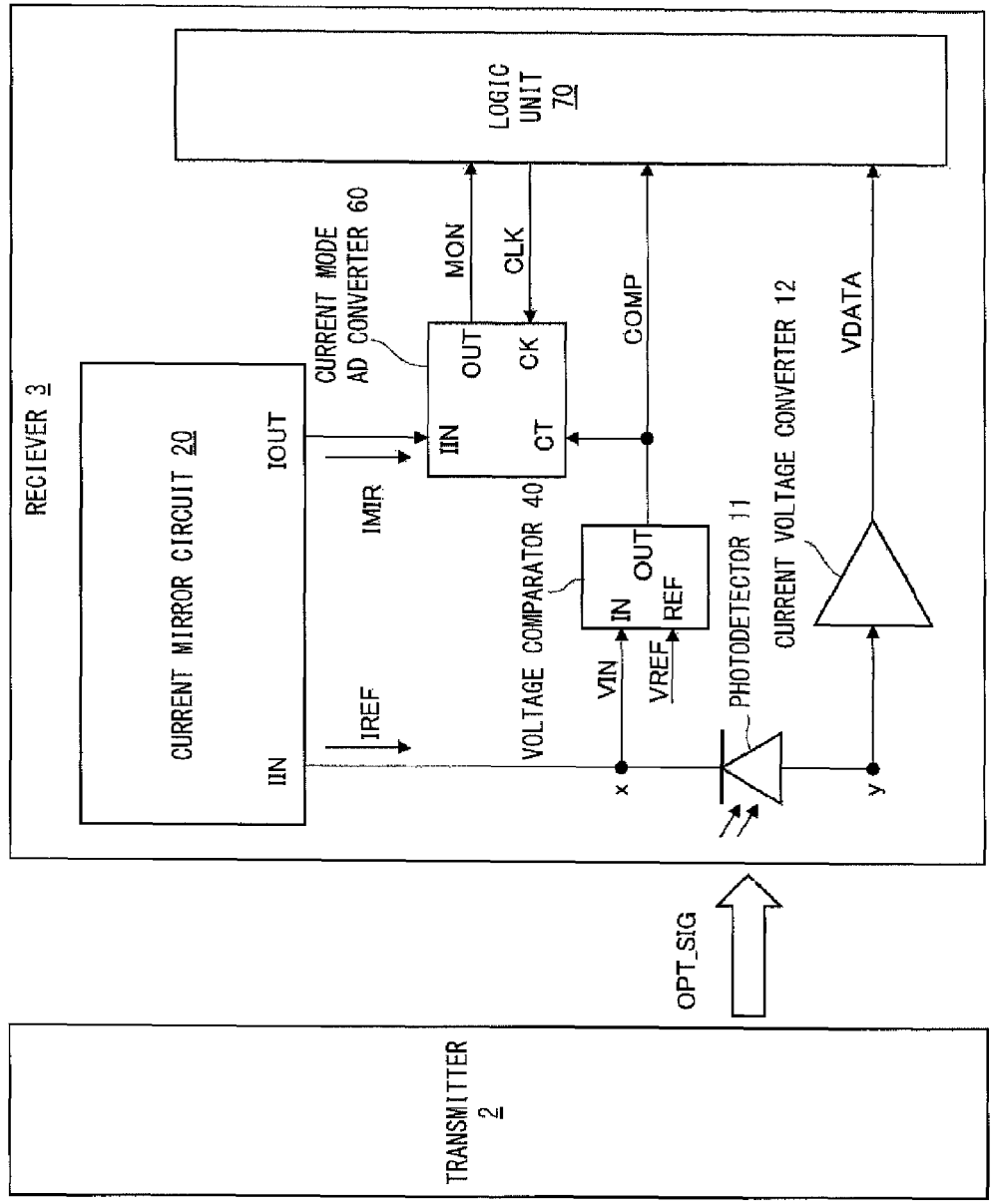
FIG. 3 is a diagram showing an example of an apparatus configuration comprising a receiver of an optical signal according to one or more embodiments of the present invention.

FIG. 3 is a diagram showing an example of an apparatus configuration comprising a receiver of an optical signal according to one or more embodiments of the present invention. As shown in FIG. 3, the apparatus configuration according to the one or more embodiments of the present invention may comprise a transmitter 2 and a receiver 3.

The transmitter 2 may be, for example, a transmission unit of a PON (Passive Optical Network). The PON is a communication system using optical signals and is a communication system in which a diverging device is inserted between a transmitter and a receiver to diverge one optical fiber into a plurality of optical fibers to transmit optical signals to the plurality of receivers through the diverged optical fibers. The transmitter 2 may generate an optical signal OPT_SIG based on control by another external apparatus (not shown) or by a control apparatus of the transmitter 2 (not shown) and may output the optical signal to a photodetector 11 of the receiver 3.

The receiver 3 may be, for example, a reception unit of the PON. The receiver 3 may convert the optical signal OPT_SIG output from the transmitter 2 to a current signal and further convert the converted current signal to a voltage signal to execute various processes according to the voltage signal. The receiver 3 may also convert the signal strength of the optical signal OPT_SIG output from the transmitter 2 to a current signal, further convert the converted current signal to a digital signal, and then measure the signal strength of the optical signal OPT_SIG based on the digital signal. The receiver 3 may comprise, for example, the photodetector 11, the current mirror circuit 20, a current voltage converter 30, a voltage comparator 40, a current mode AD (Analog-Digital) converter 60, and a logic unit 70. In the receiver 3, a node x may be provided on wiring connected with the current input terminal IIN of the current mirror circuit 20, the photodetector 11, and an input terminal IN of the voltage comparator 40. In the receiver 3, a node y may be provided on wiring connected with the photodetector 11 and the current voltage converter 30.

In the receiver 3, the photodetector 11, the current mirror circuit 20, and the current voltage converter 30 may constitute a current path of the reference current IREF. In the current path, the reference current IREF may flow from the power line VDD of the current mirror circuit 20 to a grounding wire GND of the current voltage converter 30 through the photodetector 11.

The photodetector 11 may be, for example, a photodiode. The photodetector 11 may convert the optical signal OPT_SIG output from the transmitter 2 to a current signal to supply the reference current IREF to each component. Specifically, the photodetector 11 may generate the reference current IREF at a predetermined efficiency based on the optical signal OPT_SIG output from the transmitter 2, output the reference current IREF as a current signal to the current voltage converter 30, and draw the reference current IREF from the current mirror circuit 20. The anode terminal of the photodetector 11 may be connected to the current voltage converter 30 through the node y, and the cathode terminal of the photodetector 11 may be connected to the current input terminal IIN of the current mirror circuit 20 and the input terminal IN of the voltage comparator 40 through the node x. The reference current IREF may indicate information of the potential strength of the node x of the optical signal OPT_SIG and information of data to be received indicated by the optical signal OPT_SIG.

The potential of the node x may become higher than the potential of the node y due to the current path, and the photodetector 11 may be driven by a reverse bias, the magnitude of which is a potential difference between the node x and the node y. The current mirror circuit 20 and the current voltage converter 30 may determine the magnitude of the reverse bias to be equal to or greater than a predetermined magnitude based on the reference current IREF generated by the photodetector 11.

The current mirror circuit 20 may amplify the reference current IREF drawn from the current input terminal IIN by the photodetector 11 at the predetermined magnification to output the mirror current IMIR from the current output terminal IOUT to a current input terminal IIN of the current mode AD converter 60. The current mirror circuit 20 may also determine the potential of the node x that is the same potential as the node a (see FIG. 1) based on the reference current IREF.

The current voltage converter 30 may be, for example, a TIA (Trans Impedance Amplifier) and may convert the current signal converted by the photodetector 11 to a voltage signal, output the voltage signal to the logic unit 70, and determine the potential of the node y based on the current signal. Specifically, the current voltage converter 30 may convert the reference current IREF, which is output from the photodetector 11, from the current signal to a voltage signal VDATA and may output the voltage signal VDATA to the logic unit 70. The current voltage converter 30 may determine the potential of the node y according to a voltage drop generated based on the reference current IREF.

The voltage comparator 40 may control a predetermined conversion rate of the current mode AD converter 60 based on an input potential VIN that is the potential of the node x determined by the current mirror circuit 20 and may output information of the predetermined conversion rate to the logic unit 70. Specifically, the voltage comparator 40 may compare the input potential VIN supplied to the input terminal IN and a reference potential VREF supplied from a bias circuit (not shown) to a reference terminal REF to determine whether the input potential VIN is higher than the reference potential VREF. If the voltage comparator 40 determines that the input potential VIN is higher than the reference potential VREF, the voltage comparator 40 may generate, for example, a comparison signal COMP with a potential equivalent to the potential of the grounding wire GND (i.e., "L") and may output the signal from an output terminal OUT to a control terminal CT of the current mode AD converter 60 and to the logic unit 70. On the other hand, if the voltage comparator 40 determines that the input potential VIN is not higher than the reference potential VREF, the voltage comparator 40 generates, for example, the comparison signal COMP with a potential equivalent to the potential of the power line VDD (i.e., "H") and may output the signal from the output terminal OUT to the control terminal CT of the current mode AD converter 60 and to the logic unit 70. The voltage comparator 40 may have a hysteresis in the relationship between the input potential VIN and the potential of the comparison signal COMP, and the details will be described later.

The current mode AD converter 60 may convert the information of the strength of the optical signal OPT_SIG indicated by the mirror current IMIR output from the current mirror circuit 20 into a digital signal at the predetermined conversion rate controlled by the voltage comparator 40 and may output the digital signal to the logic unit 70. Specifically, based on a predetermined clock CLK output from the logic unit 70 to a clock terminal CK, the current mode AD converter 60 may convert the mirror current IMIR supplied from the current mirror circuit 20 to the current input terminal IIN into a monitor signal MON at the predetermined conversion rate according to the comparison signal COMP output from the voltage comparator 40 to the control terminal CT and may output the signal from the output terminal OUT to the logic unit 70. The predetermined conversion rate may be a low value if the potential of the comparison signal COMP output from the voltage comparator 40 is, for example, "H" and may be a high value if the potential of the signal is, for example, "L."

The logic unit 70 may execute various processes according to the content of the optical signal OPT_SIG converted to the voltage signal by the current voltage converter 30. Further, the logic unit 70 may measure the strength of the optical signal OPT_SIG based on the information of the predetermined conversion rate of the current mode AD converter 60 output from the voltage comparator 40 and the information of the strength of the optical signal OPT_SIG converted to the digital voltage signal by the current mode AD converter 60. Specifically, the logic unit 70 may execute various processes according to the content of the voltage signal VDATA output from the current voltage converter 30. The logic unit 70 may generate the predetermined clock CLK to output the clock to the clock terminal CK of the current mode AD converter 60 and may determine the state of the comparison signal COMP output from the voltage comparator 40. The logic unit 70 may determine that the predetermined conversion rate of the current mode AD converter 60 is a low value if the potential of the comparison signal COMP is, for example, "H." On the other hand, the logic unit 70 may determine that the predetermined conversion rate of the current mode AD converter 60 is a high value if the potential of the comparison signal COMP is, for example, "L." The logic unit 70 may measure the strength of the optical signal OPT_SIG based on the determined predetermined conversion rate and the content of the monitor signal MON output from the current mode AD converter 60.

In the receiver 3 with the configuration, the photodetector 11 may generate the reference current IREF at the predetermined efficiency based on the optical signal OPT_SIG output from the transmitter 2, and the current mirror circuit 20 may further amplify the generated reference current IREF at the predetermined magnification to generate the mirror current IMIR. The receiver 3 may convert the generated mirror current IMIR to the monitor signal MON that is a digital voltage signal at the predetermined conversion rate based on the reference current IREF and may measure the strength of the optical signal OPT_SIG based on the signal and the predetermined conversion rate. Further, in the receiver 3, the current voltage converter 30 may convert the reference current IREF to the voltage signal VDATA to execute a process according to the signal.

Figure 4:
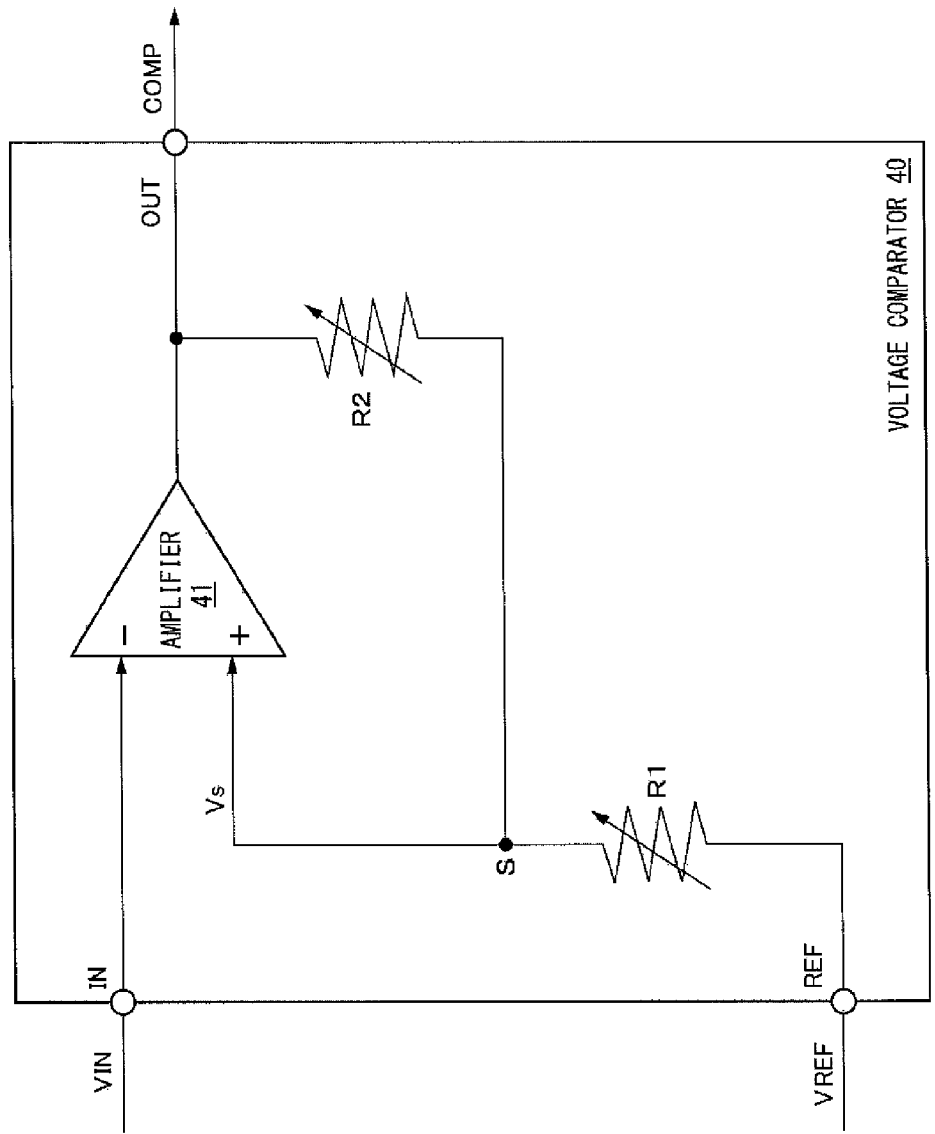
FIG. 4 is a diagram showing an example of a configuration of a voltage comparator in the receiver according to one or more embodiments of the present invention.

FIG. 4 is a diagram showing an example of a configuration of the voltage comparator in the receiver according to one or more embodiments of the present invention. Specifically, FIG. 4 is a diagram showing an example of a configuration of the voltage comparator 40 when the voltage comparator 40 in the receiver 3 has a hysteresis in relation to input and output characteristics. As shown in FIG. 4, the voltage comparator 40 may comprise, for example, an amplifier 41 and variable resistances R1 and R2. In the voltage comparator 40, a node s is provided on wiring connected with a non-inverted terminal "+" of the amplifier 41 and the variable resistances R1 and R2.

The amplifier 41 may be, for example, an operational amplifier. The amplifier 41 may compare the potential of the input potential VIN input to an inverted terminal "−" and the potential of a potential Vs of the node s input to the non-inverted terminal "+" to determine whether the input potential VIN is smaller than the potential Vs of the node s. If the amplifier 41 determines that the input potential VIN is smaller than the potential Vs of the node s, the amplifier 41 may generate the comparison signal COMP with the potential "H" and may output the signal to the variable resistance R2, the current mode AD converter 60, and the logic unit 70. On the other hand, if the amplifier 41 determines that the input potential VIN is not smaller than the potential Vs of the node s, the amplifier 41 may generate the comparison signal COMP with the potential "L" and may output the signal to the variable resistance R2, the current mode AD converter 60, and the logic unit 70.

The variable resistances R1 and R2 may be, for example, polysilicon resistances or diffusion resistances and may form a voltage divider to generate the potential Vs of the node s. The voltage divider constituted by the variable resistances R1 and R2 may divide the potential of the output terminal OUT and the potential of the reference terminal REF to generate the potential Vs of the node s and may supply the potential to the non-inverted terminal "+" of the amplifier 41. The potential Vs of the node s may depend on the potential of the output terminal OUT. Since the potential of the output terminal OUT is typically one of "H" and "L," the potential Vs of the node s may be determined to be one of two potentials based on the potential "H" and "L" of the output terminal OUT.

Figure 5:
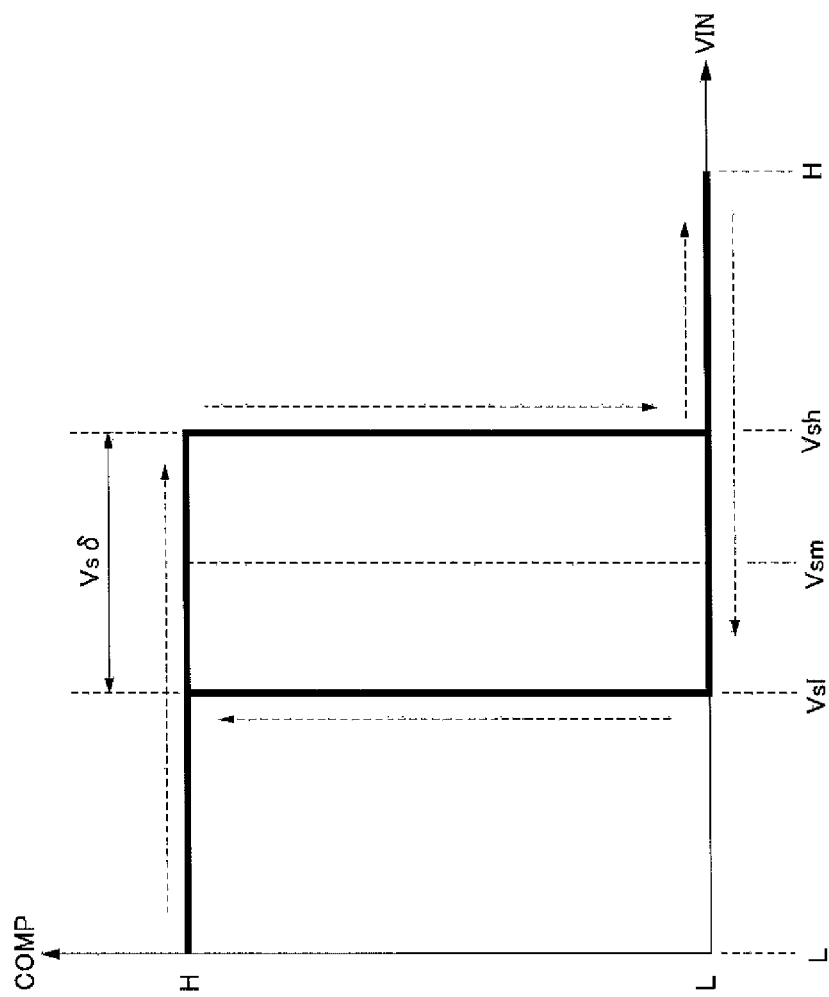
FIG. 5 is a diagram showing a relationship between the potential of an input terminal and the potential of an output terminal of the voltage comparator in the receiver according to one or more embodiments of the present invention.

The operation of the voltage comparator 40 will be described with reference to FIGS. 4 and 5. FIG. 5 is a diagram showing a relationship between the potential of the input terminal and the potential of the output terminal of the voltage comparator in the receiver according to one or more embodiments of the present invention. It is assumed in FIG. 5 that the reference potential VREF is in a relationship indicated by (H+L)/2 (i.e., average value of "H" and "L") for the simplification of the description. In FIG. 5, the potentials of the node s when the potential of the comparison signal COMP in "H" and "L" are defined as "Vsh" and "Vsl," respectively. In FIG. 5, the potential difference and the average value of "Vsh" and "Vsl" are defined as "Vsδ" and "Vsm," respectively.

It is assumed that in the voltage comparator 40, an input potential VIN with the potential "L" is supplied to the input terminal IN, and the amplifier 41 outputs the comparison signal COMP with the potential "H." In this case, the potential Vs of the node s may be "Vsh." When the input potential VIN rises in this state, the amplifier 41 may output the comparison signal COMP with the potential "H" until the input potential VIN exceeds "Vsh" and may shift the potential of the comparison signal COMP from "H" to "L" when the input potential VIN exceeds "Vsh." The following Expression 1 indicates "Vsh."

$$Vsh=(VREF \times R2)/(R1+R2)+(VDD \times R1)/(R1+R2) \quad \text{<Expression 1>}$$

It is assumed in the voltage comparator 40 that the input potential VIN with the potential "H" is supplied to the input terminal IN, and the amplifier 41 outputs the comparison signal COMP with the potential "L." In this case, the potential Vs of the node s is "Vsl." When the input potential VIN drops in this state, the amplifier 41 may output the comparison signal COMP with the potential "L" until the input potential VIN falls below "Vsl" and may shift the potential of the comparison signal COMP from "L" to "H" when the input potential VIN falls below "Vsl." The following Expression 2 indicates "Vsl."

$$Vsl=VREF \times R2/(R1+R2) \quad \text{<Expression 2>}$$

Therefore, the voltage comparator 40 may set the potential of the input terminal IN for switching the potential of the comparison signal COMP to the upper limit "Vsh" and the lower limit "Vsl" in a range of potential with the width "Vsδ" around the reference potential VREF. The following Expressions 3 and 4, which are calculated based on Expressions 1 and 2, indicate "Vsm" and "Vsδ" respectively.

$$Vsm=(VREF \times R2)/(R1+R2)+(½) \times VDD \times R1/(R1+R2) \quad \text{<Expression 3>}$$

$$Vsδ=(VDD \times R1)/(R1+R2) \quad \text{<Expression 4>}$$

As indicated by Expressions 3 and 4, the voltage comparator 40 may determine "Vsδ" and "Vsm" based on the variable resistances R1 and R2 and the reference potential VREF. Therefore, the receiver 3 can control the reference potential VREF and the resistance values of the variable resistances R1 and R2 to set "Vsδ" and "Vsm" to arbitrary potentials.

As described above, when the voltage comparator 40 outputs the comparison signal COMP with the potential "H," the voltage comparator 40 may shift the potential of the comparison signal COMP from "H" to "L" once the input potential VIN exceeds "Vsh." On the other hand, when the voltage comparator 40 outputs the comparison signal COMP with the potential "L," the voltage comparator 40 may shift the potential of the comparison signal COMP from "L" to "H" once the input potential VIN falls below "Vsl." Therefore, the voltage comparator 40 may change the potential of the input potential VIN that shifts the potential of the comparison signal COMP according to the potential of the comparison signal COMP, and the voltage comparator 40 can prevent frequent shifts of the potential of the comparison signal COMP caused by fluctuation of the input potential VIN around the potential that shifts the potential of the comparison signal COMP.

Figure 6:
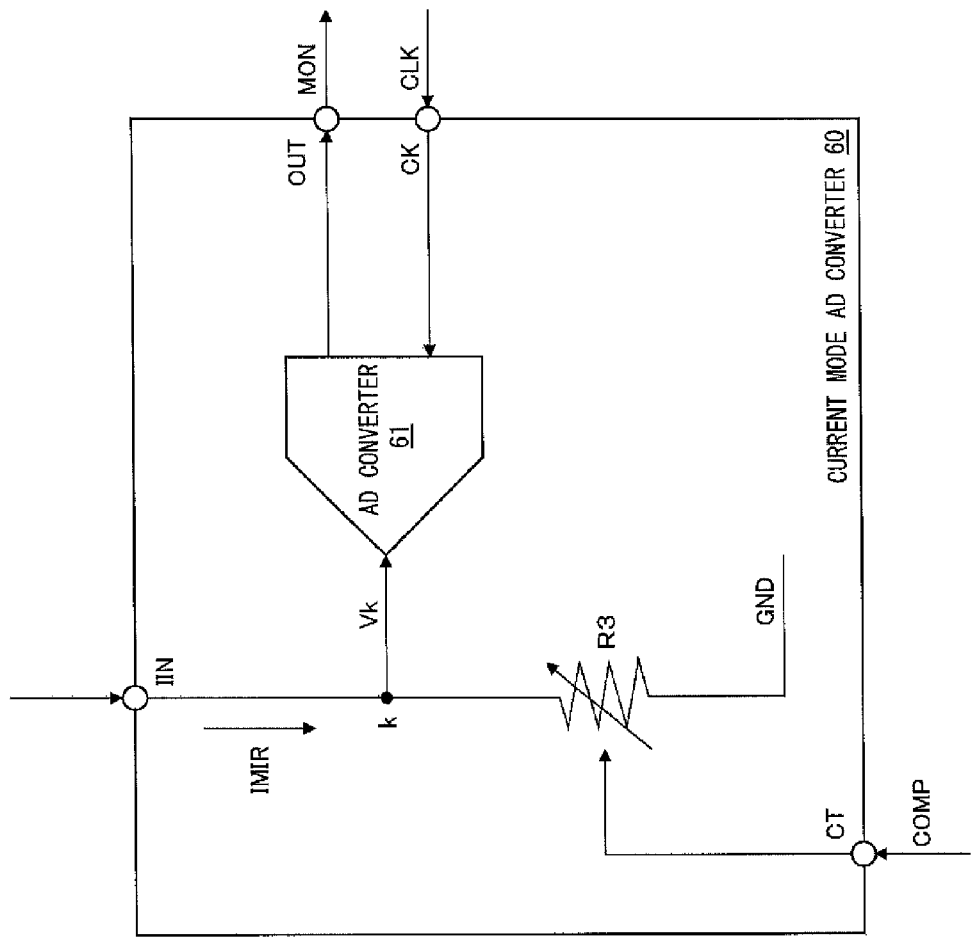
FIG. 6 is a diagram showing an example of a configuration of a current mode AD converter according to one or more embodiments of the present invention.

FIG. 6 is a diagram showing an example of a configuration of the current mode AD converter according to one or more embodiments of the present invention. As shown in FIG. 6, the current mode AD converter 60 may comprise a variable resistance R3 and an AD (Analog-Digital) converter 61. In the current mode AD converter 60, a node k may be provided on wiring connected with the current input terminal IIN, the AD converter 61, and the variable resistance R3.

The variable resistance R3 may convert the information of the strength of the optical signal OPT_SIG indicated by the mirror current IMIR output from the current mirror circuit 20 into an analog voltage signal. The voltage comparator 40 may control the resistance value of the variable resistance R3. Specifically, the variable resistance R3 may determine the potential of the node k based on the resistance value of the variable resistance R3 and the mirror current IMIR output from the current mirror circuit 20 and may handle the potential as an analog voltage signal Vk. The resistance value of the variable resistance R3 may be a low resistance value if the potential of the comparison signal COMP output from the voltage comparator 40 is, for example, "H" and may be a high resistance value if the potential of the signal is, for example, "L."

The AD converter 61 may convert the information of the strength of the optical signal OPT_SIG converted to the analog voltage signal by the variable resistance R3 into a digital voltage signal and may output the signal to the logic unit 70. Specifically, the AD converter 61 may convert the analog voltage signal Vk converted by the variable resistance R3 to a digital voltage signal based on the predetermined clock CLK output from the logic unit 70 and may output the monitor signal MON to the logic unit 70.

As described above, the variable resistance R3 in the current mode AD converter 60 may convert the mirror current IMIR to the analog voltage signal Vk based on the resistance value controlled by the voltage comparator 40. The AD converter 61 may generate the monitor signal MON based on the converted analog voltage signal Vk. Therefore, the current mode AD converter 60 may convert the mirror current IMIR to the monitor signal MON based on the predetermined conversion rate determined by the resistance value of the variable resistance R3 that varies based on the control by the voltage comparator 40 and determined by the conversion rate of the AD converter 61.

Figure 7:
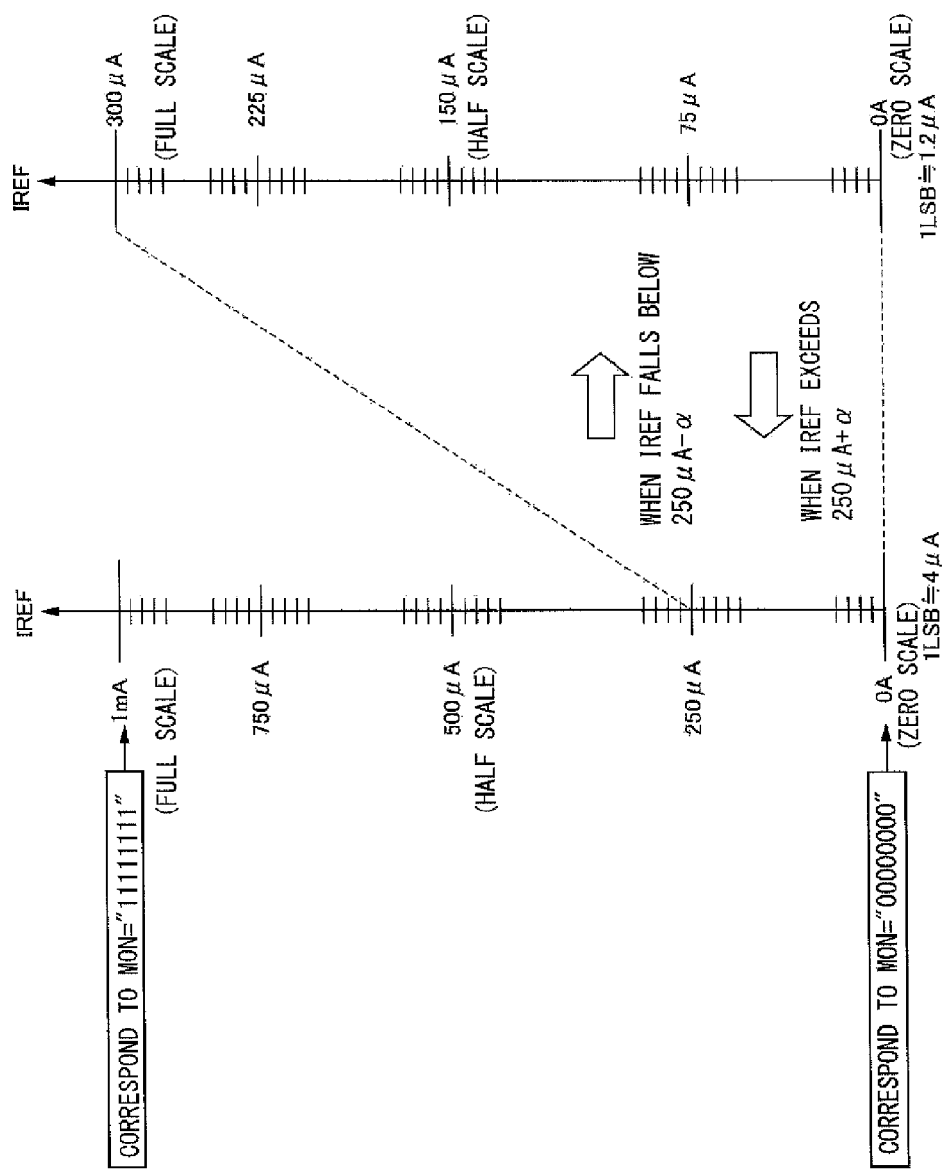
FIG. 7 is a diagram showing a relationship between a reference current and the potential of a monitor signal in the receiver according to one or more embodiments of the present invention.

FIG. 7 is a diagram showing a relationship between the reference current and the potential of the monitor signal in the receiver according to one or more embodiments of the present invention. It is assumed in FIG. 7 that the AD converter 61 in the current mode AD converter 60 converts the analog voltage signal Vk to the monitor signal MON of eight bits (i.e., 256 levels from 2^8). Further, in FIG. 7, the reference current IREF changes in a range from 0 uA to 1 mA. Further, in FIG. 7, the current values of the reference current IREF equivalent to "Vsh" and "Vsl" are 250 uA+α and 250 uA−α, respectively. Further, in FIG. 7, the predetermined magnification of the current mirror circuit 20 is 1.

It is assumed first that the reference current IREF has risen from 0 μA to 1 mA. In this case, the receiver 3 may convert the analog voltage signal Vk to the monitor signal MON until the reference current IREF exceeds 250 μA+α so that the state of the monitor signal MON corresponds to, for example, "00000000" (i.e., zero scale) and "11111111" (i.e., full scale) when the reference current IREF is 0 μA and 300 μA, respectively. In this case, an LSB (Least Significant Bit) of the receiver 3 may be a value substantially equal to 1.2 μA calculated from 300 μA/256.

The receiver 3 may change the conversion rate from the analog voltage signal Vk to the monitor signal MON when the reference current IREF exceeds 250 μA+α so that the state of the monitor signal MON corresponds to the zero scale and the full scale when the reference current IREF is 0 μA and 1 mA, respectively. In this case, the LSB of the receiver 3 may be a value substantially equal to 4 μA calculated from 1 mA/256.

It is assumed that the reference current IREF has dropped from 1 mA to 0 μA. In this case, the receiver 3 may convert the analog voltage signal Vk to the monitor signal MON until the reference current IREF falls below 250 μA−α so that the state of the monitor signal MON corresponds to the zero scale and the full scale when the reference current IREF is 0 μA and 1 mA, respectively. In this case, the LSB of the receiver 3 may be a value substantially equal to 4 μA as described above.

The receiver 3 may change the conversion rate from the analog voltage signal Vk to the monitor signal MON when the reference current IREF falls below 250 μA−α so that the state of the monitor signal MON corresponds to the zero scale and the full scale when the reference current IREF is 0 μA and 300 μA, respectively. In this case, the LSB of the receiver 3 may be a value substantially equal to 1.2 μA as described above.

As described above, the voltage comparator 40 and the current mode AD converter 60 in the receiver 3 may change the conversion rate from the reference current IREF to the monitor signal MON according to the current value of the reference current IREF. Therefore, the receiver 3 can measure the strength of the optical signal OPT_SIG at a resolution according to the current value of the reference current IREF. The receiver 3 may set the predetermined conversion rate so that the current values of the reference current IREF that change the predetermined conversion rate of the current mode AD converter 60 at the rise and at the drop of the reference current IREF are different. Therefore, the receiver 3 can prevent frequent changes in the resolution caused by fluctuation of the current value of the reference current IREF around the current value that changes the resolution in the measurement of the strength of the optical signal OPT_SIG.

Although the receiver 3 may change the predetermined conversion rate of the current mode AD converter 60 between two levels according to the current value of the reference current IREF in the present example, the arrangement is not limited to this situation. The receiver 3 may comprise, for example, a plurality of voltage comparators 40 and a plurality of variable resistances R3 in the current mode AD converter 60 to change the predetermined conversion rate between arbitrary levels.

Figure 8:
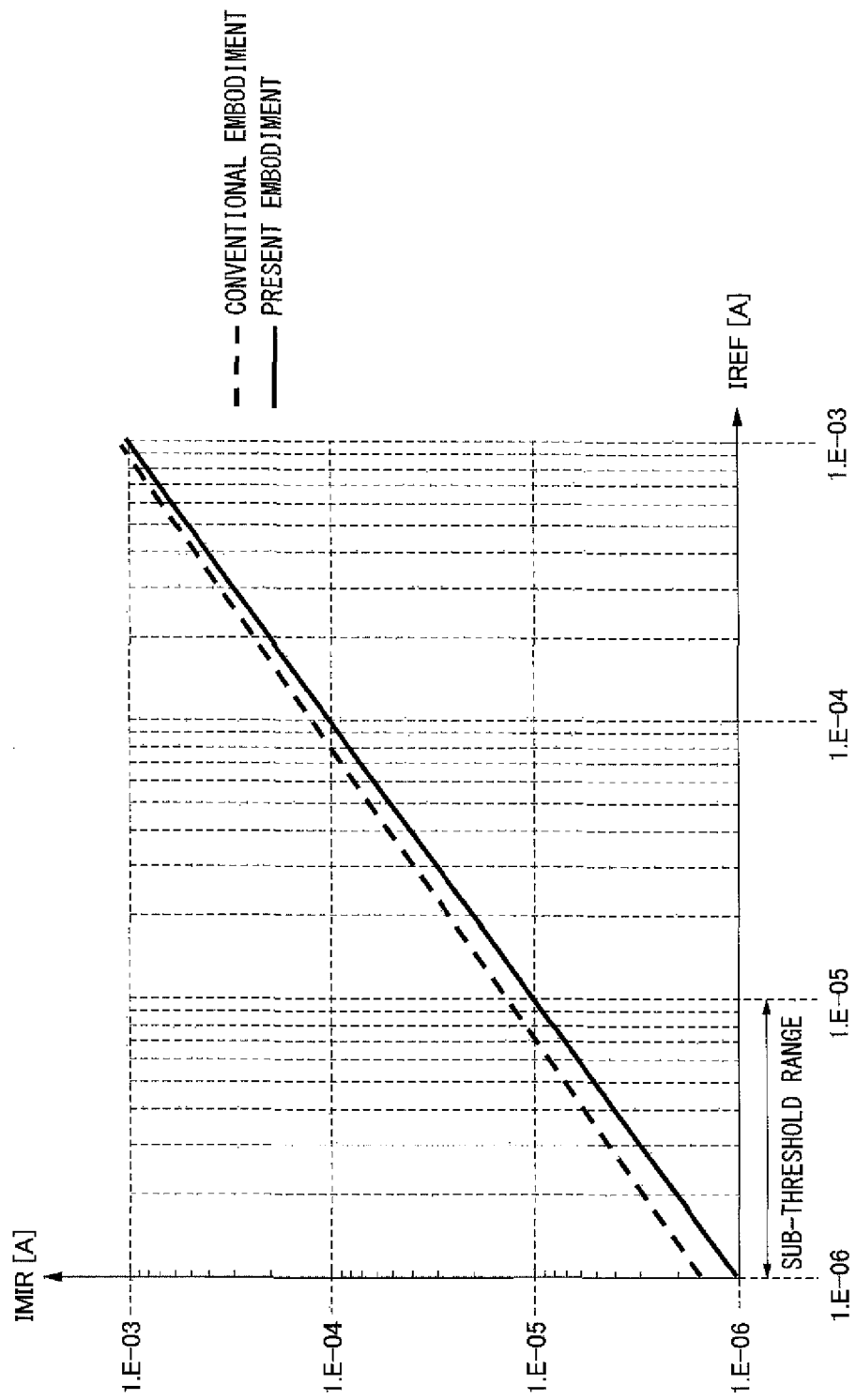
FIG. 8 is a diagram showing a relationship between the reference current and a mirror current of the current mirror circuit in the receiver according to one or more embodiments of the present invention.

FIG. 8 is a diagram showing a relationship between the reference current and the mirror current of the current mirror circuit in the receiver according to one or more embodiments of the present invention. For comparison, FIG. 8 also illustrates a relationship between the reference current IREF and the mirror current IMIR in the conventional current mirror circuit (thick broken line). The conventional current mirror circuit may be constituted by excluding the drain potential mirror unit 21 from the current mirror circuit 20. It is assumed in FIG. 8 that the predetermined magnifications of the conventional current mirror circuit and the current mirror circuit 20 are both 1.

As shown in FIG. 8, the current mirror circuit 20 in the receiver 3 highly accurately amplifies the reference current IREF to generate the mirror current IMIR, compared to the conventional current mirror circuit. Further, while the accuracy of the conventional current mirror circuit generating the mirror current IMIR is reduced with a decrease in the current value of the reference current IREF, the current mirror circuit 20 highly accurately generates the mirror current IMIR regardless of the current value of the reference current IREF. For example, when the reference current IREF is at 1.E-06 [A] in the sub-threshold range, the conventional current mirror circuit generates the mirror current IMIR with the current value slightly below about 2.E-06 [A], while the current mirror circuit 20 generates the mirror current IMIR with the current value substantially at 1.E-06 [A].

Figure 9:
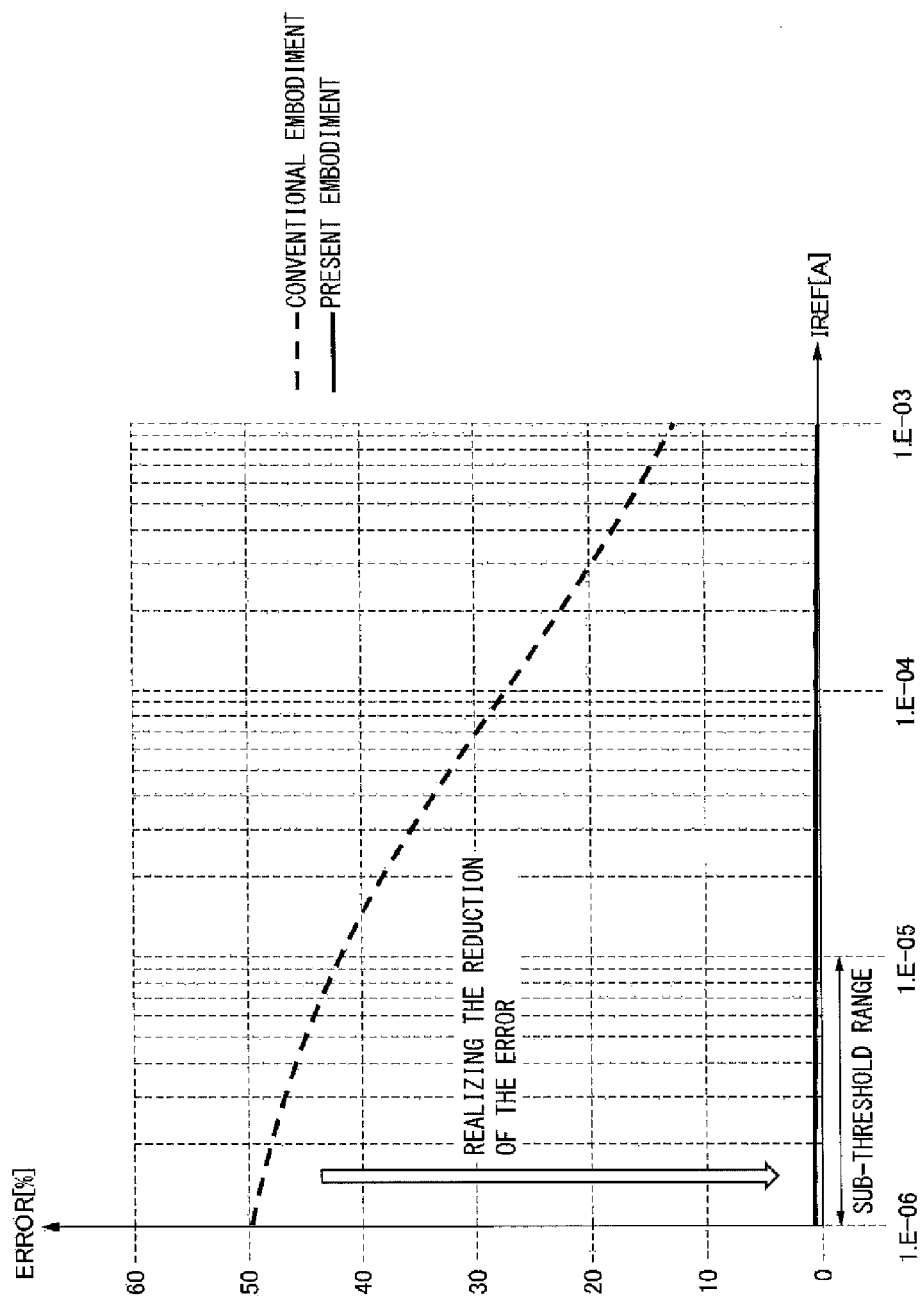
FIG. 9 is a diagram showing a relationship between the reference current and an error rate, which is the error rate between reference current and mirror current in the receiver, according to one or more embodiments of the present invention.

FIG. 9 is a diagram showing a relationship between the reference current and an error rate in the receiver according to one or more embodiments of the present invention. The error rate is defined as a difference between a reference current IREF and a mirror current IMIR. For comparison, FIG. 9 also illustrates a relationship between the reference current IREF and such an error rate in the conventional receiver (thick broken line). The conventional receiver includes the conventional current mirror circuit described above, not the current mirror circuit 20.

As shown in FIG. 9, the receiver 3 has a lower error rate than the conventional receiver. Further, the error rate significantly increases with a decrease in the current value of the reference current IREF in the conventional current mirror circuit, whereas the error rate is not much affected by the current value of the reference current IREF in the receiver 3 according to the present embodiment. For example, when the reference current IREF is at 1.E-03 [A], the conventional receiver has an error rate of approximately 13%, whereas the receiver 3 has an error rate of approximately 0%. For example, when the reference current IREF is at 1.E-06 [A] within the sub-threshold range, the conventional receiver has an error rate of approximately 50%, whereas the receiver 3 has an error rate of approximately 1%.

As described above, the receiver 3 can operate at a wide range of the reference current IREF by a simple circuit configuration and may further comprise the current mirror circuit 20 that can highly accurately amplify the reference current IREF. Therefore, the receiver 3 can highly accurately measure the strength of the optical signal OPT_SIG while preventing an increase in the chip area and handling a wide range of the reference current IREF.

The receiver 3 according to one or more embodiments of the present invention may further comprise the voltage comparator 40 having a hysteresis in the input and output characteristics, and under the control by the voltage comparator 40, the current mode AD converter 60 may change the predetermined conversion rate for converting the mirror current IMIR to the digital voltage signal. Therefore, the receiver 3 can change the resolution in the measurement of the strength of the optical signal OPT_SIG according to the magnitude of the reference current IREF. The receiver 3 can also prevent frequent changes in the resolution caused by fluctuation of the current value of the reference current IREF around the current value that changes the resolution in the measurement of the strength of the optical signal OPT_SIG.

The above-described embodiments are merely examples for explaining the present invention and are not intended to limit the present invention. The present invention can be achieved in various forms without departing from the scope of the present invention.

For example, the steps, the operations, or the functions may be implemented in parallel or in different orders in the method disclosed in the present specification as long as the results are not inconsistent. The described steps, operations, and functions are just provided as examples, and some of the steps, the operations, and the functions may be omitted without departing from the scope of the invention or may be combined with each other. Other steps, operations, or functions may also be added.

Although various embodiments are disclosed in the present specification, specific features (technical matters) in one embodiment may be appropriately modified and added to other embodiments, or the specific features may be replaced with specific features in the other embodiments. These modes are also included in the scope of the present invention.

The present invention can be widely used in the field of semiconductor integrated circuit. Thus, various changes may be made to the above embodiments without departing from the scope of the present invention. While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A current mirror circuit comprising:
   a first transistor and a second transistor which share a power supply; and
   a drain potential mirror unit that determines a predetermined potential of a drain of the second transistor such that the predetermined potential is equal to a potential of a drain of the first transistor determined based on a reference current generated by a current source,
   wherein the second transistor supplies a mirror current to a load circuit based on the predetermined potential of the drain of the second transistor and the potential of the drain of the first transistor, and
   wherein a drain potential mirror unit that amplifies the reference current generated by a current source at a first magnification to generate a first current, amplifies the generated first current at a second magnification to generate a second current, and determines the predetermined potential of the drain of the second transistor based on the second current.

2. The current mirror circuit according to claim 1, wherein the first magnification and the second magnification are designed such that the predetermined potential is equal to a potential of a drain of the first transistor.

3. The current mirror circuit according to claim 1, wherein the drain potential mirror unit comprises:
   a third transistor and a sixth transistor which share the power supply shared by the first transistor; and
   a fourth transistor and a fifth transistor which have a common source potential, and
   wherein the drain potential mirror unit supplies the first current from the third transistor to the fourth transistor based on a potential of a gate of the first transistor determined based on the reference current, supplies the second current from the fifth transistor to the sixth transistor based on a potential of a gate of the fourth transistor determined based on the first current, and determines, as the predetermined potential, a potential of a gate of the sixth transistor based on the second current.

4. The current mirror circuit according to claim 3, wherein the drain potential mirror unit further comprises a seventh transistor provided between the second transistor and the load circuit.

5. The current mirror circuit according to claim 4, wherein a potential equal to a potential of a drain of the sixth transistor is provided to a gate of the seventh transistor.

6. The current mirror circuit according to claim 3,
   wherein the first transistor, the second transistor, the third transistor, and the sixth transistor are PMOS transistors, and
   wherein the fourth transistor and the fifth transistor are NMOS transistors.

7. The current mirror circuit according to claim 3,
   wherein the first transistor, the second transistor, the third transistor, and the sixth transistor are NMOS transistors, and
   wherein the fourth transistor and the fifth transistor are PMOS transistors.

8. The current mirror circuit according to claim 1, wherein the drain potential mirror unit further comprises a transistor provided between the second transistor and the load circuit.

9. A receiver that measures a strength of an optical signal output from a transmitter, the receiver comprising:
   a photodetector that generates a reference current based on the optical signal;
   a current mirror circuit that amplifies the reference current at a predetermined magnification to generate a mirror current;
   a current mode AD converter that converts the mirror current to a digital voltage signal at a predetermined conversion rate; and
   a logic unit that measures the strength of the optical signal indicated by the digital voltage signal,
   wherein the current mirror circuit comprises:
   a first transistor and a second transistor which share a power supply; and a drain potential mirror unit that determines a predetermined potential of a drain of the second transistor such that the predetermined potential is equal to a potential of a drain of the first transistor determined based on a reference current generated by a current source, wherein the second transistor supplies the mirror current to the current mode AD converter based on the potential of the drain of the first transistor determined based on the reference current.

10. The receiver according to claim 9, wherein the drain potential mirror unit that amplifies the reference current at a first magnification to generate a first current, amplifies the generated first current at a second magnification to generate a second current, and determines a predetermined potential of a drain of the second transistor based on the second current.

11. The receiver according to claim 10, wherein the first magnification and the second magnification are designed such that the predetermined potential is equal to a potential of a drain of the first transistor.

12. The receiver according to claim 10, wherein the drain potential mirror unit comprises:

a third transistor and a sixth transistor which share the power supply shared by the first transistor; and a fourth transistor and a fifth transistor which have a common source potential, and wherein the drain potential mirror unit supplies the first current from the third transistor to the fourth transistor based on a potential of a gate of the first transistor determined based on the reference current, supplies the second current from the fifth transistor to the sixth transistor based on a potential of a gate of the fourth transistor determined based on the first current, and determines, as the predetermined potential, a potential of a gate of the sixth transistor based on the second current.

13. The receiver according to claim 12, wherein the drain potential mirror unit further comprises a seventh transistor provided between the second transistor and the load circuit, and wherein the drain potential mirror unit supplies a potential equal to a potential of a drain of the sixth transistor to a gate of the seventh transistor.

14. The receiver according to claim 9, further comprising a voltage comparator that compares a first potential determined based on the reference current and a second potential based on a bias circuit to determine whether the first potential is higher than the second potential, wherein the current mode AD converter determines the predetermined conversion rate based on the determination by the voltage comparator, and wherein the logic unit measures the strength of the optical signal indicated by the digital voltage signal according to the determination by the voltage comparator.

15. The receiver according to claim 14, wherein the current mode AD converter comprises:

a variable resistance with a resistance value determined based on the determination by the voltage comparator, the variable resistance converting the mirror current to an analog voltage signal at a voltage drop according to the mirror current; and an AD converter that converts the analog voltage signal to the digital voltage signal.

16. The receiver according to claim 14, wherein the current mode AD converter sets the predetermined conversion rate to a first value if the voltage comparator determines that the first potential is higher than the second potential and sets the predetermined conversion rate to a second value not higher than the first value if the voltage comparator determines that the first potential is not higher than the second potential.

17. The receiver according to claim 14, wherein the voltage comparator generates a comparison signal with a potential determined based on the determination, and determines the second potential based on the potential of the comparison signal.

18. The receiver according to claim 17, wherein the voltage comparator:

determines a state of the comparison signal to be a first state if the voltage comparator determines that the first potential is higher than the second potential, determines the state of the comparison signal to be a second state if the voltage comparator determines that the first potential is not higher than the second potential, determines the second potential to be a third potential if the state of the comparison signal is the first state, and determines the second potential to be a fourth potential higher than the third potential if the state of the comparison signal is the second state.

19. The receiver according to claim 14, further comprising a plurality of the voltage comparators, wherein the plurality of voltage comparators determine the second potentials so that the second potentials are different, and wherein the current mode AD converter determines the predetermined conversion rate based on the determinations by the plurality of voltage comparators.

20. The receiver according to claim 19, wherein the current mode AD converter comprises:

a plurality of variable resistances with resistance values determined based on the determinations by the corresponding plurality of voltage comparators, the plurality of variable resistances converting the mirror current to an analog voltage signal at a voltage drop according to the mirror current; and an AD converter that converts the analog voltage signal to the digital voltage signal.

* * * * *